United States Patent
Rau

(10) Patent No.: US 7,229,723 B2
(45) Date of Patent: Jun. 12, 2007

(54) METHOD FOR FORMING AN OPENING IN A LIGHT-ABSORBING LAYER ON A MASK

(75) Inventor: Jenspeter Rau, München (DE)

(73) Assignee: Infineon Technologies AG, Neubiberg (DE)

( * ) Notice: Subject to any disclaimer, the term of this patent is extended or adjusted under 35 U.S.C. 154(b) by 507 days.

(21) Appl. No.: 10/789,994

(22) Filed: Mar. 2, 2004

(65) Prior Publication Data

US 2004/0197676 A1 Oct. 7, 2004

(30) Foreign Application Priority Data

Mar. 4, 2003 (DE) ................. 103 09 266

(51) Int. Cl.
*G03F 1/00* (2006.01)
*G03C 5/00* (2006.01)

(52) U.S. Cl. .......................... 430/5; 430/394

(58) Field of Classification Search ............ 430/5, 430/394, 322–324
See application file for complete search history.

(56) References Cited

U.S. PATENT DOCUMENTS 6,764,808 B2* 7/2004 Okoroanyanwu et al. ... 430/311
2003/0031956 A1* 2/2003 Wijnaendts et al. ........ 430/302

* cited by examiner

*Primary Examiner*—S. Rosasco
(74) *Attorney, Agent, or Firm*—Edell, Shapiro & Finnan, LLC

(57) ABSTRACT

An opening is formed in a light-absorbing layer on a mask by applying a second resist above a first resist on the layer. A first exposure step with subsequent development of the second resist leads to the formation of a first opening in the developed second resist. The first resist is uncovered on an area within the opening. A second exposure step is performed by irradiation of the mask in a second segment, which is laterally offset with respect to the first opening, so that an incomplete portion of the area of the uncovered first resist is exposed within the opening. After a further development step and an etching step with formation of a second opening in the developed first resist with a transfer of the portion into the light-absorbing layer, this opening has a diameter smaller than both the first and the second segment.

12 Claims, 2 Drawing Sheets

METHOD FOR FORMING AN OPENING IN A LIGHT-ABSORBING LAYER ON A MASK

CROSS REFERENCE TO RELATED APPLICATIONS

This application claims priority under 35 USC §119 to German Application No. 10309266.8, filed on Mar. 4, 2003, and titled "Method For Forming an Opening In a Light-Absorbing Layer On a Mask," the entire contents of which are hereby incorporated by reference.

FIELD OF THE INVENTION

The invention relates to a method for forming an opening in a light-absorbing layer on a mask for the projection of a structure pattern onto a substrate.

BACKGROUND

Masks are used in semiconductor fabrication for the projection of a structure pattern formed on them onto a substrate, for example, a semiconductor wafer. The structure pattern imaged on the substrate in a photosensitive layer is transferred into underlying layers on the substrate in a number of subsequent processes in order to form a respectively desired plane of an integrated circuit. The structure patterns to be projected by the mask include, in each case, openings which are formed within a nontransparent, light-absorbing layer.

If transmission masks are involved, then the light-absorbing layer is arranged as a chromium layer, for example, on a transparent substrate, for example, quartz. Radiation is sent through the mask in order to project the structure pattern onto the substrate.

If a reflection mask is involved, then the light-absorbing layer with the openings formed therein is arranged on a thin reflective layer stack of alternate layers made, for example, of silicon and molybdenum. This layer stack is patterned on a silicon carrier, for example. In this case, the substrate is understood to be the silicon carrier including the reflective layer stack.

By analogy, to fabricate integrated circuits with other higher packing densities, it is a challenge in the development of new mask technologies likewise to be able to fabricate increasingly smaller structures, i.e., openings in the light-absorbing layers on a mask. For this purpose, still higher resolution have progressively been used, following the respective current technology. As an alternative, etching processes have been developed in which the etch bias may be as small as possible.

Openings within a light-absorbing layer on a mask are fabricated in a manner similar to that when patterning a semiconductor wafer by exposure of a photosensitive resist with subsequent development and transfer of the developed, i.e., stripped-out structures into the underlying, light-absorbing layer. The exposure is effected by a light or particle beam generated, for example, by lasers, electron beam or ion beam projection sources.

Typically, the surface of the mask coated with the resist is scanned by the beam at the desired positions. Higher resolutions can be achieved by using shorter wavelengths in the case of light beams and by higher and higher acceleration energies in the case of particle beams.

Since the openings produced in the resist on the mask after development also cannot be transferred dimensionally accurately in an anisotropic etching step for opening the underlying light-absorbing layer, the diameters of the holes etched out in the underlying layer are widened with respect to the diameter of the openings in the resist produced by the ion or light beam. An etch bias can be optimized by a high degree of anisotropy in the etching process and also by a choice of the respectively adjustable etching parameters, for instance, etching time or dose, adapted to the layer thickness of the underlying layer.

At the present time, the minimum structure widths that can be achieved on a mask, i.e., the resolution, on account of the particle or laser beam technique taking account of the demagnifying projection onto a wafer (for example, factor 4 or 5), are smaller than the structure widths that can be resolved by projection on the wafer. However, by virtue of improved projection techniques, the reduction of the resolution on the wafer is advancing more rapidly than, for instance, in the case of mask fabrication. It is therefore to be expected that, in the foreseeable future, the resolution that can be achieved on a mask will be the cause of the minimum widths of structures in the integrated circuits then to be fabricated.

However, the capital expenditure in the area of mask development is very high for the companies fabricating mainly only medium-sized masks. There is a particular need here to find particularly cost-effective methods which make it possible to achieve higher resolutions on the mask at least transitionally or when special structure layers are present.

SUMMARY

The present invention can provide a cost-effective method. A method for forming an opening in a light-absorbing layer on a mask can include providing a mask having a substrate, on which the light-absorbing layer is arranged, applying a first resist on the light-absorbing layer, applying a second resist above the first resist, first exposing of the second resist by irradiation of the mask in a first segment, first developing of the second resist in order to form a first opening in the developed second resist, so that the first resist is uncovered on an area within the opening, second exposing of the first resist by irradiation of the mask in a second segment, which is laterally offset with respect to the first opening, so that an incomplete portion of the area of the uncovered first resist is exposed within the opening, second developing of the first resist in order to form a second opening in the developed first resist below the first opening, etching of the light-absorbing layer in order to form the opening in the light-absorbing layer, and removing of the developed first and of the second resist.

In this case, an alternative is to perform the two exposures and then to strip out the polymer in a single or two progressive development steps.

According to the present invention, the first and the second resist can be arranged indirectly or directly one above the other and, in each case, can be subject to an exposure step. The diameter of an opening transferred into the light-absorbing layer by an etching process can be reduced with respect to the diameters of the beams, respectively, used for the exposure by bringing the two beams onto the surface of the mask in a manner laterally offset relative to one another in terms of their position.

By way of example, the upper, second resist can have a photosensitivity only with respect to the light radiated in during the first exposure step, and the first resist can have a photosensitivity only with respect to the light irradiated in during the second exposure step. The lateral offsetting with respect to a basic area of the mask of the light beam used for the second exposure then has the effect that the second resist, which is not photosensitive with respect to the light beam of the second exposure, occurs as masking layer. Consequently, with the use of positive resists, the overlap region of the two light beams, i.e., the overlap region between the first opening formed after the first exposure and development step and the particle or light beam of the second exposure, can be transferred into the light-absorbing layer. The larger the lateral offset selected the smaller the opening, which is formed in the light-absorbing layer.

In each case, light sources can have a resolution that is lower than the structure width to be achieved. In particular, cost-effective older apparatuses may be used in this case.

Instead of two light beams having a different wavelength in the ultraviolet wavelength range, electron or ion beams can be used. Consideration can be given to a combination of a light beam and an electron or ion beam for the two exposure steps.

Formation of an intermediate layer between the first and the second resist. In particular, an antireflection layer can be used here. If the latter is formed such that it can be removed in a dedicated etching step, then light or particle beams having the same wavelength for the first and the second exposure of the first and second resists can be used. The intermediate layer can then take into account the shading effect, prior to the transfer into the light-absorbing layer, outside the overlap region of the two beams of the first and second exposure operations.

The first exposure can be carried out at a first resist formed as a negative resist. In this case, a first opening can be produced in the first resist at the location of the nonexposed resist areas by the subsequent developing operation.

The terms "laterally offset" and "overlap area" are in the sense of a reference to absolute positions on the mask. In the exposure steps, i.e., the first and the second exposure step, it is possible in each case for a beam to move to absolute positions, for example, by a coordinate grid, which is predetermined after carrying out an alignment step and assigns positions to coordinates, in a mask writer. The lateral offset may be selected by choosing coordinates that lie close together while taking account of the respectively known beam width in order to form an overlap area. In this case, beam width may also be understood to be an area scanned by the beam. In the case of electron beam writers, for example, structures having the smallest possible width can be formed in the resist by progressive exposure of a plurality of adjacent scanning points.

With regard to the exposure system used for an exposure step, a range of the ratio of the resolutions between the first and the second exposure step can be used. The first exposure step to have a higher resolution than the second step, and vice versa.

Fabrication of small diameter openings in a light-absorbing layer is possible even though, for example, only 248 nm and, respectively, 365 nm laser technologies are used for the exposure, as a considerable proportion of the costs for fabricating a high-resolution mask can be saved.

BRIEF DESCRIPTION OF THE DRAWINGS

The invention will now be explained in more detail using an exemplary embodiment with the aid of a drawing, in which.

DETAILED DESCRIPTION

Figure 1:
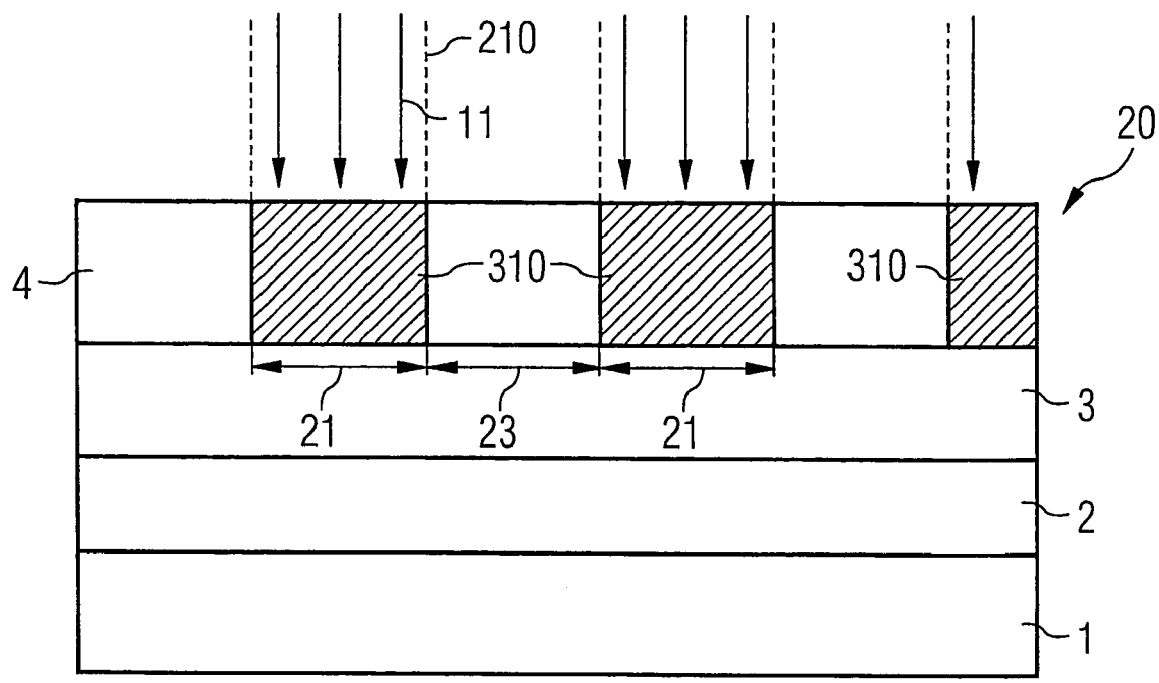
FIGS. 1–4 show a sequence of process steps in accordance with an exemplary embodiment according to the invention with a cross section through a mask.

An exemplary embodiment of the present invention is shown in FIGS. 1 to 4. FIG. 1 shows a cross section through a mask 20 with a substrate 1, on which a light-absorbing layer 2, a first resist 3 and also a second resist 4 are arranged. In the case where a transmission mask is used, the substrate 1 can include a quartz material.

By contrast, if an EUV reflection mask (EUV: extreme ultraviolet) is involved, for example, then the substrate 1 can include a silicon substrate, for example, on which an alternating layer stack of reflective layers, for example, molybdenum and silicon, is arranged.

The first resist 3 and the second resist 4 can be spun on, for example, in successive resist-coating steps onto the substrate 1 coated with the absorber layer 2. In order that the first resist 3 is not incipiently stripped through applying a second resist 4, it is possible, for example, to provide an intermediate layer (not shown here).

As is shown in FIG. 1, a first exposure 11 of the second resist 4 on the mask 20 can be carried out. The exposure can be effected by a laser writer, which generates a laser beam having a wavelength of 248 nm. The laser beam can scan those positions on the mask surface formed by the second resist which are predetermined for a structure formation in accordance with a design layout provided in electronic form. In the exemplary embodiment, the second resist 4 is a positive resist. The laser beam having the wavelength 248 nm can produce a segment 210 having a diameter 21 of through-exposed regions 310 as far as a lower limit of 300 nm. The laser beam itself may in this case have a smaller width; it is usually necessary to expose a plurality of adjacent scanning points in the second resist 4 on the mask surface in order to achieve a structure formation, i.e., to enable a through-exposure of the second resist 4.

Figure 2:
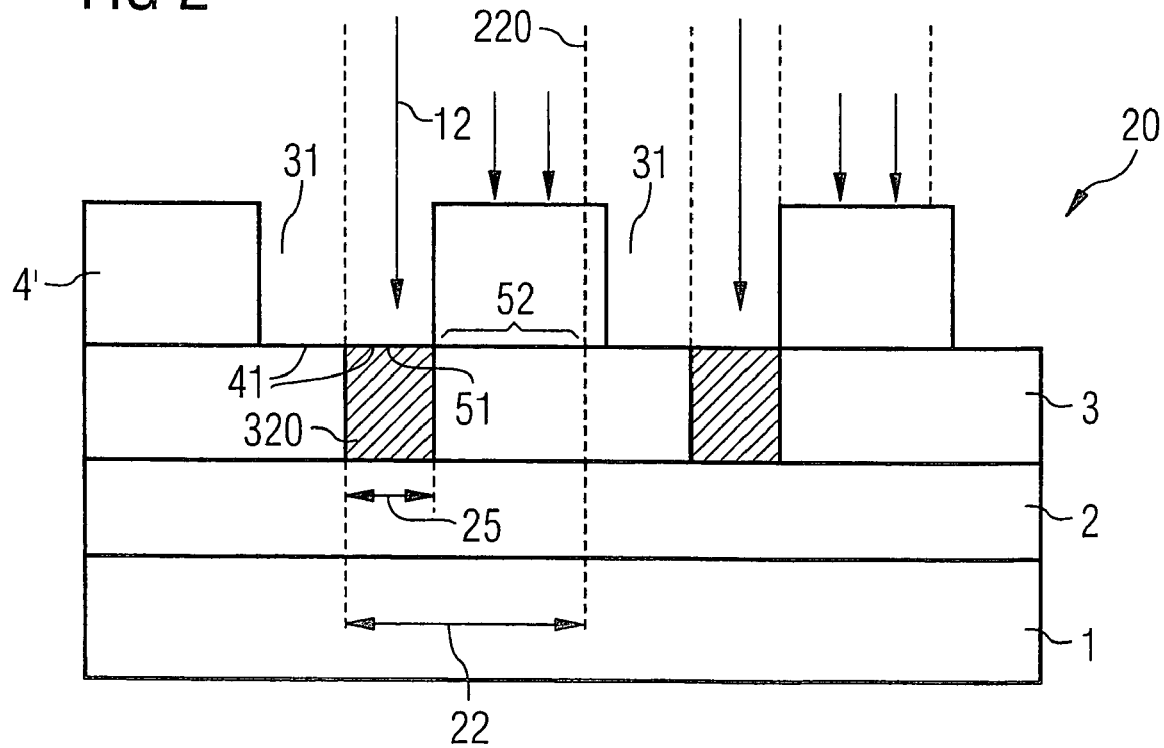

The second resist 4, which is photosensitive with respect to light having the wavelength 248 nm, can subsequently be developed. The exposed resist parts can be stripped out. First openings 31 can form in the developed resist 4', as is shown in FIG. 2. The openings 31 have the smallest possible diameter 21 of 300 nm. On account of a slight development bias of 20 nm, the width 23 of adjacent openings 31 is only 260 nm. For the sake of clarity, the relevant reference symbols are illustrated in FIG. 1 with reference to the exposed regions and not in FIG. 2 with reference to the openings 31.

The first resist 3 is not photosensitive with respect to the light having a wavelength of 248 nm. The depth of the exposed regions 310 and thus of the openings 31 can end at the boundary layer between the second resist 4 and the first resist 3 or at an intermediate layer arranged, if appropriate, between them.

If an intermediate layer was established between the first resist 3 and the second resist 4, for example, as an antireflection layer (ARC=antireflection coating), then a short etching step can be carried out in this case in order to remove this layer at the bottom of the openings 31, so that a segment of the first resist 3 is uncovered.

In a next step, a second exposure 12 can be carried out. In this case, the beam can be guided over the mask surface to irradiate a segment 220 on an idealized basic area on the mask 20. The basic area of the mask can include a part 51 of the basic area 41 of the opening 31. That segment in the first resist 3 which is located below the partial area 51 can be exposed, while a portion 52 of the resist 3 which is located below the developed second resist 4', and in the direction of which the beam of the second exposure 12 falls, can be shaded by the second resist 4'.

A laser writer whose generated light beam amounts to a wavelength of 365 nm can be used for the second exposure 12. Such a light beam can form exposed segments 220 in the first resist 3 whose lower limit value is 440 nm. In an exemplary embodiment, a light beam 12 having precisely this lowest possible diameter, as described above, can be directed onto the mask surfaces in a manner laterally offset with respect to the first opening 31. Relative to an idealized mask basic area, a common overlap area 51 would be exposed both by the beam 11 generated during the first exposure and by the beam 12 generated by the second exposure. The common overlap area has a diameter 25 having a width of only 180 nm. The region which is exposed in the first resist 3 has precisely the diameter 25 of 180 nm on account of the shading effect by virtue of the developed resist 4'.

The overlap area of the first opening 31 and the exposed mask surface during the second exposure 12 can be critical. In the case of the positive resist shown here, this condition is the same as an overlap area of the first beam and the second beam 12.

Figure 3:
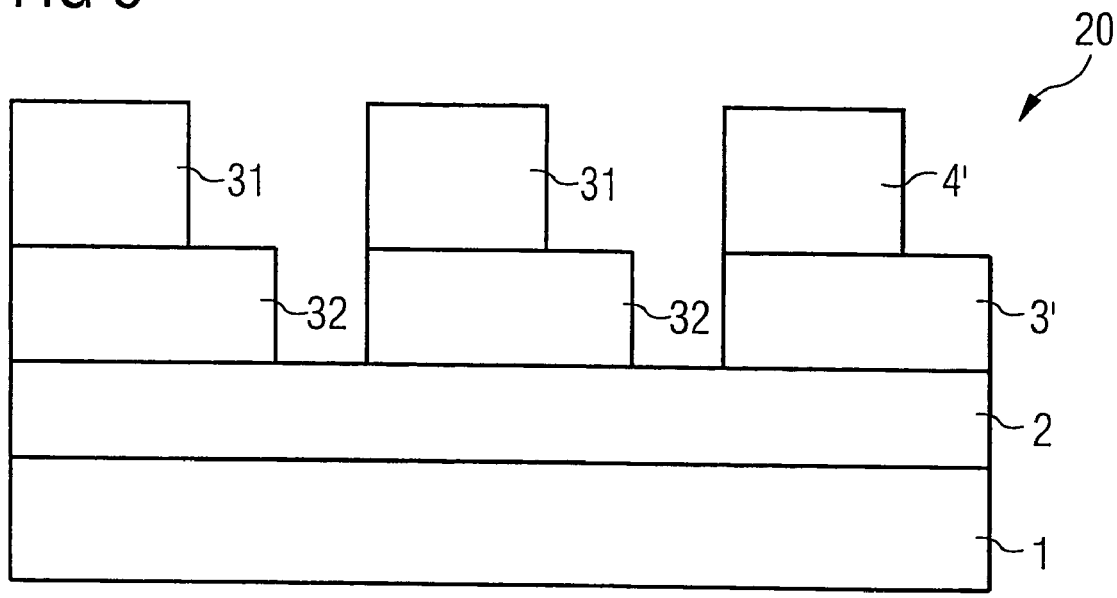

A further development step can eliminate the exposed portion of the first resist 3 in order to form a second opening 32 below the first opening 31 (FIG. 3). The developed first resist 3' and the developed second resist 4' can jointly form an etching mask for carrying out an anisotropic etching process 15. However, it is also possible, at the state now reached, firstly to remove the second developed resist 4'.

Figure 4:
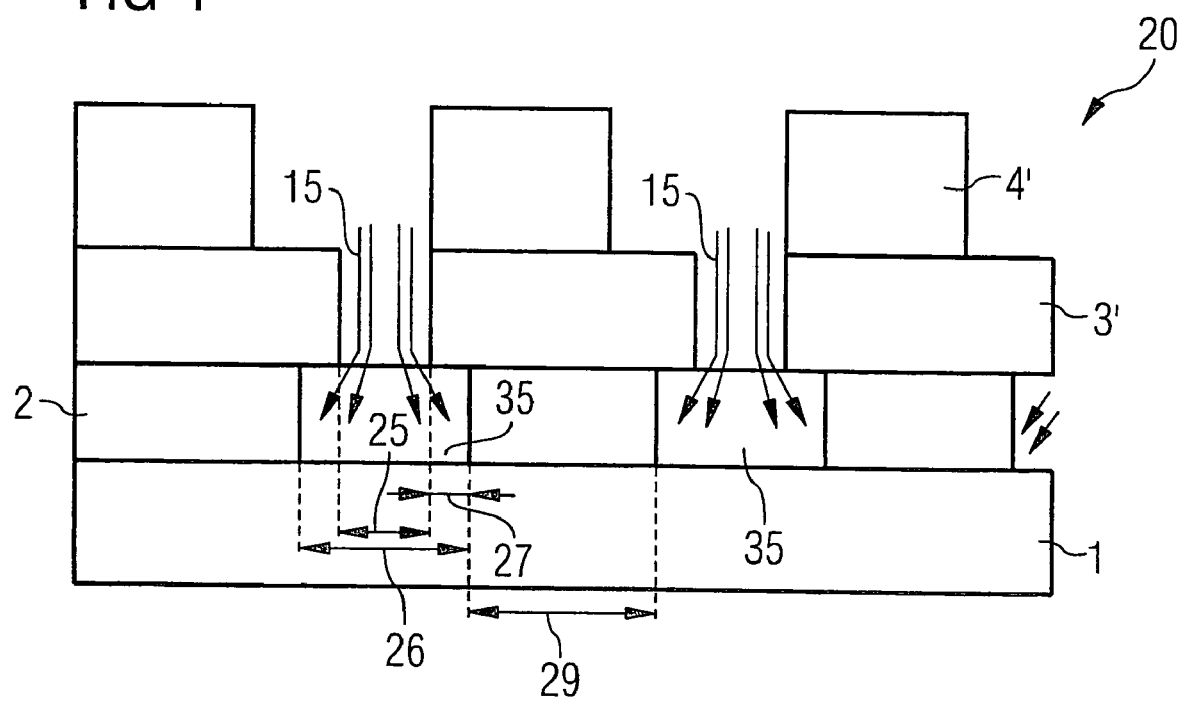

FIG. 4 shows how an opening 35, whose diameter 26 has a width of 280 nm, can be produced by setting an etch bias 27 of 50 nm while taking account of possible edge roundings at the etching sidewalls in the absorbing layer 2. The distance 29 between the opening 35 and an adjacent opening 35 in the light-absorbing layer 2 can be 280 nm. The widths 26 of the openings 35 can lie below the smallest possible structure widths that can be produced with the laser beam used.

The residual developed resist portions 3' and/or 4' can then be removed in further steps. If an EUV reflection mask with a buffer layer (not shown here) typically arranged between the substrate 1 with the alternating layer stack and the absorber layer 2 were used, then etching or repair steps for opening the buffer layer or for repairing any defects that occur can be necessary in further process steps.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS

1 Mask substrate, quartz plate, silicon carrier with reflective layer stack
2 Light-absorbing layer, opaque chromium layer, absorber layer in the case of reflection mask
3 First resist
3' First resist, developed
4 Second resist
4' Second resist, developed
11 First exposure
12 Second exposure
15 Etching
20 Mask
21 Diameter of the first segment in second resist
22 Diameter of the second segment in first resist
23 Distance between exposed regions in the first resist
25 Diameter of the exposed portion in the first resist at the basic area of the first opening
26 Diameter of the opening in the light-absorbing layer
29 Distance between adjacent openings in the light-absorbing layer
31 First opening in second resist
32 Second opening in first resist
41 Basic area of the first opening on first resist
51 Exposed portion of the basic area of the first opening in first resist
210 First exposed segment in second resist
220 Second exposed segment in first resist
310, 320 Exposed resist portions

I claim:

1. A method for forming an opening in a light-absorbing layer on a mask, comprising the following steps:
   providing the mask, the mask having a substrate on which the light-absorbing layer is arranged;
   applying a first resist on the light-absorbing layer;
   applying a second resist above the first resist;
   exposing the second resist by irradiation of the mask with a first exposure such that a first segment is defined along the second resist;
   developing the second resist to form a first opening along the first segment in the developed second resist, so that the first resist is uncovered on an area within the first opening;
   exposing the first resist by irradiation of the mask with a second exposure in a second segment which is laterally offset with respect to the first segment such that a portion of the second segment overlaps the first segment in a common overlap area and exposes only a portion of the first resist uncovered within the first opening of the second resist, with a non-overlapping portion of the second segment being shaded by the second resist adjacent the first opening, wherein the exposed portion of the first resist in the common overlap area is smaller than the first segment and smaller than the second segment;
   developing the first resist in the common overlap area to form a second opening in the developed first resist below the first opening, such that the second opening is smaller than the first opening;
   etching the light-absorbing layer below the second opening to form the opening in the light-absorbing layer; and
   removing the developed first and the second resist.

2. The method as claimed in claim 1, wherein;
   the first resist is photosensitive with respect to light having a first wavelength and is not photosensitive with respect to light having a second wavelength;
   the second resist is photosensitive with respect to light having the second wavelength and is not photosensitive with respect to light having the first wavelength;
   light having the first wavelength is used during the first exposure; and
   light having the second wavelength is used during the second exposure.

3. The method as claimed in claim 2, wherein light having a wavelength of 248 nanometers is used for the first exposure and light having a wavelength of 365 nanometers is used for the second exposure.

4. The method as claimed in claim 2, wherein light having a wavelength of 248 or 348 nanometers is used for the first exposure and an electron or ion beam is used for the second exposure.

5. The method as claimed in claim 1, wherein the developing of the first resist and the developing of the second resist are carried out using an identical developer solution in an uninterrupted process step.

6. The method as claimed in claim 5, wherein a negative resist is used for the second resist so that, during development of the second resist, non-exposed resist portions are stripped out in order to form the first opening.

7. The method as claimed in claim 1, wherein the second resist is removed before the etching step.

8. The method as claimed in claim 1, wherein an antireflection layer is arranged on the first resist between the application of the first resist and the application of the second resist.

9. The method as claimed claim 1, wherein a first mask writer having a resolution limit which can be achieved on the mask in the course of writing with a beam is used for the second exposure of the second segment, and the second segment is exposed on the mask with a diameter of between one and one and a half the resolution limit that can be achieved with the mask writer.

10. The method as claimed in claim 9, wherein a second mask writer having a further resolution limit that can be achieved on the mask in the course of writing with a beam is used for the first exposure of the first segment, and the first segment is exposed on the mask with a diameter of between one and one and a half times the farther resolution limit that can be achieved with the second mask writer.

11. The method as claimed in claim 2, wherein light having a wavelength of 365 nanometers is used for the first exposure and light having a wavelength of 248 nanometers is used for the second exposure.

12. The method as claimed in claim 2, wherein an electron or ion beam is used for the first exposure and light having a wavelength of 248 or 365 nanometers is used for the second exposure.

* * * * *